United States Patent [19]

Kobeda et al.

[11] Patent Number: 5,208,170
[45] Date of Patent: May 4, 1993

[54] METHOD FOR FABRICATING BIPOLAR AND CMOS DEVICES IN INTEGRATED CIRCUITS USING CONTACT METALLIZATION FOR LOCAL INTERCONNECT AND VIA LANDING

[75] Inventors: Edward Kobeda; Gary L. Patton, both of Poughkeepsie, N.Y.

[73] Assignee: International Business Machines Corporation, Armonk, N.Y.

[21] Appl. No.: 761,596

[22] Filed: Sep. 18, 1991

[51] Int. Cl.⁵ .......................................... H01L 21/265
[52] U.S. Cl. ....................... 437/34; 437/31; 437/183; 437/189; 437/200
[58] Field of Search ............. 437/31, 192, 183, 200, 437/34, 196, 189; 148/DIG. 50, DIG. 147

[56] References Cited

U.S. PATENT DOCUMENTS

| | | | |
|---|---|---|---|
| 4,358,891 | 11/1982 | Roesner | 148/DIG. 147 |
| 4,398,335 | 8/1983 | Lehrer | 437/200 |
| 4,671,970 | 6/1987 | Keiser et al. | 427/93 |
| 4,764,484 | 8/1988 | Mo | 437/203 |
| 4,829,024 | 5/1989 | Klein et al. | 437/192 |
| 4,884,123 | 11/1989 | Dixit et al. | 437/192 |
| 4,948,755 | 8/1990 | Mo | 437/195 |
| 4,962,414 | 4/1990 | Liou et al. | 437/200 |
| 4,992,391 | 2/1991 | Wang | 437/200 |
| 4,994,410 | 2/1991 | Son et al. | 437/200 |
| 5,057,447 | 10/1991 | Paterson | 437/192 |

FOREIGN PATENT DOCUMENTS 63-168034  7/1988  Japan.

*Primary Examiner*—Brian E. Hearn
*Assistant Examiner*—Kevin M. Picardat
*Attorney, Agent, or Firm*—Charles B. Lobsenz; John J. Goodwin; John D. Crane

[57] ABSTRACT

A method for fabricating bipolar and CMOS devices in integrated circuits using W as a local interconnect and via landing pad for bipolar and CMOS devices. The method includes the forming of an oxide/silicon bilayer above a local interconnect of tungsten/titanium wherein the oxide is patterned as a mask for the silicon/-tungsten/titanium reactive ion etch, and the silicon layer above the tungsten/titanium layer is used as an etch stop for a via etch. The silicon layer is then reacted and converted to titanium silicide after the via etch to provide a low resistance path in the via from the local interconnect in a self aligned manner.

2 Claims, 1 Drawing Sheet

METHOD FOR FABRICATING BIPOLAR AND CMOS DEVICES IN INTEGRATED CIRCUITS USING CONTACT METALLIZATION FOR LOCAL INTERCONNECT AND VIA LANDING

BACKGROUND OF THE INVENTION

1. Field of the Invention

The present invention relates to methods for fabricating semiconductor integrated circuits, and more particularly to the fabrication of CMOS and bipolar circuit devices having local interconnect at the device level.

2. Description of the Prior Art

U.S. Pat. No. 4,948,755, issued Aug. 14, 1990 to Mo, entitled METHOD OF MANUFACTURING SELF-ALIGNED CONFORMAL METALLIZATION OF SEMICONDUCTOR WAFER BY SELECTIVE METAL DEPOSITION, discloses a method for fabricating a semiconductor integrated circuit which includes the selective deposition of metal, such as tungsten, into a contact opening formed in a dielectric layer, followed by the deposition of a thin silicon layer over the dielectric and metal-filled opening and the deposition of a second dielectric layer over the thin silicon layer. An opening or trench is formed in the upper second dielectric layer using the silicon as an etch stop, and a metal such as tungsten is selectively deposited to fill the trench wherever the exposed silicon is present. In one embodiment of the invention, prior to the filling of the trench, the exposed silicon is reacted with a blanket layer of a metal to form a metal silicide layer at the lower surface of the trench.

The process described in this patent uses selective deposition of tungsten into a via hole, and deposits a poly-Si etch stop after the contact stud is patterned and planarized. Thus, a metal layer is used as a plug and restricted in terms of wireability. Since the poly-Si is deposited after the metal is already patterned and then silicided in the via opening only, a poly-Si runner is left across the device in regions outside the vias. Although currents normally shunt through the least resistive path, the poly-Si electrically connects the metal plugs and may adversely affect electrical behavior. This may occur through added interlevel capacitance, degraded RC delay along the conductor, and the origin of potential differences between the via paths which may accelerate metal failures. Also, this method precludes the use of local interconnect in a CMOS device, where a strap from diffusion to gate is desired for maximum wireability.

Also, the structure described in U.S. Pat. No. 4,948,755 precludes dropping a contact from second metal to the contact metal (local interconnect at device level) because poly-Si is left across the wafer outside the vias and furthermore, a nonuniform silicide will result in the via hole because the via opening is pulled back outside the metal landing. When metal is deposited for silicidation of the etch stop, silicide will grow above both metal and oxide. This will result in a nonuniform silicide structure (viz., grain growth) which may increase contact resistance.

In the disclosed process, the poly-Si is patterned directly with the W conductor and it remains along the length of the W stripe so that no additional capacitance is created outside the interconnect pattern with the process. This is important because the W is not only used as a landing pad for studs, but also as a strap between various contact regions (diffusion to gate in CMOS). Also, the structure minimizes both the nonuniformities associated with silicidation and lateral growth effects above SiO2 since the structure does not have dissimilar materials in the via.

U.S. Pat. No. 4,764,484, issued Aug. 16, 1988 to Mo, entitled METHOD FOR FABRICATING SELF-ALIGNED, CONFORMAL METALLIZATION OF SEMICONDUCTOR WAFER, discloses a method for fabricating a VLSI multilevel metallization integrated circuit in which a first dielectric layer, a thin silicon layer, and then a second dielectric layer are deposited on the upper surface of a substrate. A trench is formed in the upper, second dielectric layer leaving a thin layer of the second dielectric layer overlying the thin silicon layer. A contact hole is then etched through the central part of the thin layer of the second dielectric layer, the thin silicon layer and the first dielectric layer to the surface of the substrate. Using the remaining outer portion of the thin layer of the dielectric layer as a mask over the underlying portion of the thin silicon layer, metal such as tungsten is selectively deposited into the contact hole. The remaining portion of the thin layer of the second dielectric layer is then removed and the trench is selectively filled with a metal that is in electrical contact with the metal filling the contact hole.

In U.S. Pat. No. 4,764,484, the poly-Si etch stop is not deposited until after deposition and planarization of the first metal, and is then removed before selective metal deposition. This leaves a poly-Si conductor between all via paths above the device.

U.S. Pat. No. 4,671,970, issued Jun. 9, 1987 to Keiser et al entitled TRENCH FILLING AND PLANARIZATION PROCESS, describes a process for forming planar trench oxide isolated integrated circuit devices. In particular, the process fills trenches of diverse widths, yet provides a final structure in which the narrow trench dielectrics, the wide trench dielectrics, and the active region surfaces are substantially coplanar. Furthermore, the process reduces the likelihood of creating voids in the narrow trenches. According to one practice, following the formation of the trenches in the substrate, successive layers of conformal silicon nitride, conformal polysilicon, and relatively conformal CVD oxide are formed to the relative depth of the trenches. A photoresist mask is then first selectively formed over the central regions of the wide trenches and used as a mask during the anisotropic etch of exposed oxide. The underlying polysilicon layer serves as an oxide etchant stop, and also provides the material from which the next successive oxidation partially fills the previously etched regions with thermal silicon dioxide. A further planarizing layer of oxide is then formed by poly deposition and oxidation. The nitride layer underlying the polysilicon layer prevents oxidation of the substrate. Fabrication is concluded with a planarization to the level of the active regions, including an etch of the nitride layer over such active regions.

In U.S. Pat. No. 4,671,970, a poly-Si etch stop with nitride underneath is converted to a dielectric (non-conductor) with oxidation. This layer is utilized for isolation in trench technology and does not carry current.

Japanese patent abstract JP63-168034, published Jul. 12, 1988 and entitled FORMATION OF MULTILAYER GATE ELECTRODE OF SEMICONDUCTOR DEVICE, describes a structure to reduce the leakage current while improving the reliability by a method wherein an insulating film is laid between the sidewalls of a first layer electrode of a semiconductor device to form the second layer electrode of the flattened surface.

The first layer electrode includes a polysilicon film provided with conductivity by phosphorus diffusion and an oxide film which are patterned and formed on another oxide film on a semiconductor substrate formed by thermal oxidation. Next, a polysilicon layer to be an etch-stopper film is laminated on the surface of this electrode and then a CVD oxide film is deposited and then etched back until the layer is exposed to flatten the surface. Finally, a polysilicon layer as the second electrode is formed on the surface to notably reduce the leakage current between sidewalls by excellent thick insulating film between the pattern sidewalls as well as the second electrode is formed stably on the flat surface to improve the reliability.

In JP-63-168034, an etchback planarization scheme is described wherein CVD oxide is etched back to expose poly-Si. This method is used to shape topography and minimize leakage at sidewalls by reducing severe steps.

SUMMARY OF THE INVENTION

Recent developments in the CMOS and bipolar integrated circuits have resulted in devices capable of operating at higher speeds and characterized by reduced geometries with improved packing densities. This trend toward increasingly complex devices has pushed the limits of existing materials and fabrication processes. As geometries are reduced further into the submicron regime to increase the number of circuits on a chip, contact holes become smaller, line widths become narrower, and conventional conductors such as polysilicon exhibit higher resistance which increases RC time constants, thereby limiting the overall speed of the device.

In a conventional process used to fabricate a multilevel integrated circuit, a dielectric layer is deposited on the surface of a substrate, a contact window is formed in the dielectric, and a contact layer is deposited and etched. This contact serves as an interface between active device regions and back-end-of-line (BEOL) wiring. This layer also serves as a landing pad for a contact stud, which carries current through a via to the first metallization layer, which is separated from the substrate by a think planarized dielectric. A second via is etched into a planarized dielectric deposited above the first metal layer, filled with a suitable conductor such as tungsten (viz. contact stud), and planarized. A second metal layer is then deposited and etched. This sequence is repeated until enough material layers are available to achieve functionality in the circuits.

There are several drawbacks to the conventional metallization process described above, including the amount of area required on a chip, and the complexity and cost in fabricating more than several metal layers to obtain the number of wiring channels necessary for various circuits. Local interconnection provides a solution to these problems by wiring devices with the contact metallization layer. By definition, this interconnect is only allowed over limited distances and restricted to certain materials. This material must be thin so as not to add large excesses of topography to the device, it must be electromigration resistant to avoid the formation of voids and other failures due to high current densities (particularly in bipolar circuits), and it must be of low resistance. Also, it must be able to undergo patterning with narrow pitches (metal line+space width) to enhance chip density.

One solution to meet the requirements of a local interconnect is the application of refractory metals such as tungsten (W) and silicide ($TiSi_2$) as highly reliable conductors. The use of these materials provides an alternative to polysilicon which cannot meet the resistance requirements of future technologies, and an alternative to conventional metals such as Al which are unreliable when applied as thin films over topography.

An object of the present invention is to provide a method for fabricating bipolar and CMOS devices in integrated circuits using W as a local interconnect and via landing pad for bipolar and CMOS devices. This method may also be applied to future BiCMOS technologies, where a common metal is needed meeting the requirements of both bipolar and CMOS devices, and avoids costly processing. Specific applications include wiring a series of emitters or collectors in a current switch, and cross-coupling gates in CMOS arrays.

This invention makes use of an oxide/Si bilayer above a local interconnect of W/titanium (Ti) wherein the oxide is patterned as a mask for the Si/W/Ti reactive ion etch, and the Si layer above the W/Ti is used as an etch stop for the via etch. The Si layer is then reacted and converted to $TiSi_2$ after the via etch to provide a low resistance path in the via from the local interconnect in a self aligned manner.

Figure 1:
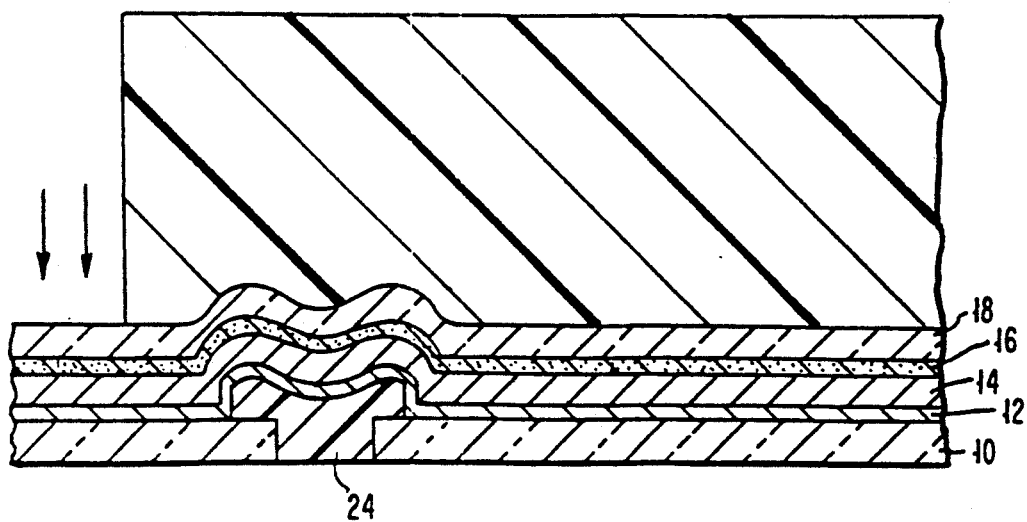
FIG. 1 is a cross-section of the film stack etched by the process of this invention.

It has been proposed that contact metal be utilized as a local interconnect and via landing for bipolar and CMOS devices. This "local wiring" at the device level consumes less area than conventional metallization because of narrow metal pitches, and minimizes process complexity by reducing the number of metal and stud layers in a given technology. A low resistance material is required to meet circuit speed requirements in bipolar applications, where local interconnect may be used to wire a series of emitters or collectors in a current switch. Although polysilicon has been used as a conductor in bipolar devices, it suffers from too high a resistivity to be used as a local interconnect. Aluminum (Al) has been used as a low resistance metal in today's circuits, but penetration problems resulting from the solid solubility of Si in Al have precluded its use near the device surface.

Tungsten (W) has recently emerged as a viable candidate for metallization due to its low resistivity (12-15 $\mu\Omega$-cm). Several problems associated with implementing W as local interconnect include erosion of the photoresist mask when defining the local interconnect pattern with RIE, and the ability to stop on the local interconnect after etching vias which differ in depth by as much as a factor of 2. This differences emphasizes the importance of a critical etch stop when opening vias to the contact metal layer.

The present invention proposes a new integrated process which utilizes W as an interconnect level metal. The fabrication scheme includes the steps of depositing a Ti layer 12 and W layer 14 on a $SiO_2$ substrate 10. The Ti layer 12 is deposited prior to the W layer 14 to improve adhesion to the substrate 10. The method further includes the step of providing a Si layer 16 and a silicon dioxide layer 18 above the W layer 14 which serves several functions. The oxide layer 18 is patterned as a mask for the reactive ion etching (RIE) of the local interconnect (or Si/W/Ti layered structure) and is compatible with the via etch that follows. After the interconnect structure is etched, additional oxide is deposited and planarized in blanket fashion resulting in the interlevel dielectric layer 20 (and layer 18). The via level is then patterned, with the Si layer 16 between the oxide layer 18 and W layer 14 used as an etch stop material for via etch of layers 18 and 20. The Si layer 16 is then converted to a $TiSi_2$ area 22 after the via etch, providing a low resistance path from the interconnect to the via. The process flow for this method is described in detail below, with the features making this invention unique pointed out.

FIG. 1 depicts a cross section of the film stack to be etched during this process. This section assumes an overlapping contact to poly-Si (e.g. emitter) and a via landing off the contact area. The oxide mask is first patterned in this process using photoresist as a mask. High selectivity to Si is achieved by increasing the $H_2$ content in a $CF_4$ plasma. This increase alters the F/c ratio (1) in favor of oxides as H scavenges F radicals to form HF and reduce the Si etch rate, while $SiO_2$ continues to etch in $CF_3+$ and other species. Selectivities of over 40 to 1 for oxide to Si are available in the art, and other combinations of F-based etching could be readily applied.

After etching the oxide layer 18, the photoresist mask is stripped and the metal composite layer of Si layer 16, W layer 14, and Ti layer 12 is etched in a $Cl_2$ plasma. In order to avoid undercut of the film stack, the RIE is operated at low pressures. Since the volatility of Si and transition metal chlorides is relatively low, and since the selectivity of the etch to the underlying oxide substrate 10 is critical, $O_2$ is added to the etching ambient. This addition is believed to form more volatile etch products which enhance etch rates relative to the $SiO_2$ substrate 10.

Figure 2:
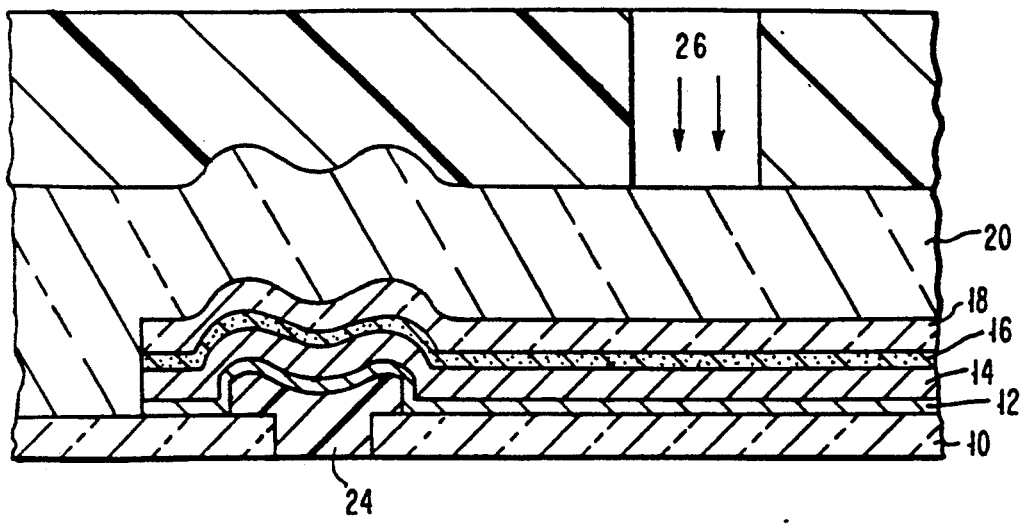
FIG. 2 is a cross-section of the film stack after defining the local interconnect pattern prior to via etching.

FIG. 2 shows the cross section after defining the local interconnect pattern but before the via etch. A thick oxide layer 20 has been deposited and planarized over the previous oxide layer 18 used as an etch mask. The new layer 20 serves to insulate the first metallization layer from the device region, avoiding poor performance or device failure resulting from coupling between levels. The Si layer 16 above the W layer 14 will act as an etch stop for the via etch and protect the metal or local interconnect surface from exposure to the etching ambient. This method preserves the interconnect thickness and the via landing and avoids metal residues or via poisoning known to occur from etching via 26.

Figure 3:
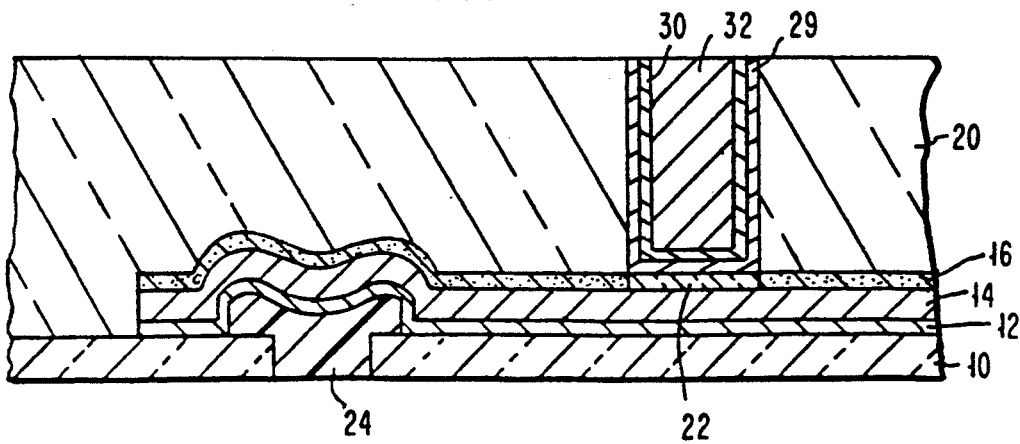
FIG. 3 is a cross-section of the film stack after a via has been formed.

After via RIE, a Ti deposition typically follows as a precursor to a TiN layer 30, and a CVD W deposition 32 to fill the via. This Ti layer 28 is used to form a low resistance silicide 22 from the Si layer 16 as seen in FIG. 3. Layer 18 is shown in FIG. 3 as part of layer 20'. Since the unreacted Ti layer (not shown) is discarded after annealing and conversion to silicide layer 22, great flexibility in the etch stop layer 16 thickness can be accommodated, providing the total thermal cycles for silicide formation do not violate thermal budget restrictions. After discarding the unreacted portion if the Ti layer (not shown), a new Ti layer 29 is deposited, followed by TiN layer 30 to act as a barrier for the CVD W layer 32 deposited and planarized in the via.

In summary, a new method is proposed for forming local interconnect with W as the main conductor. An oxide/Si(16,14) stack above the interconnect provides an etch mask and etch stop, respectively. The layers comprising the interconnect are fully integratable wit bipolar and BiCMOS processing, as the Si is converted to a silicide (22) after etch. Several advantages gained with this process include. 1) larger overetch of local interconnect can be tolerated with the oxide mask, overcoming problems associated with topography, 2) added Si thickness only above the interconnect pattern increases the amount of overetch which can be tolerated during via patterning, 3) Si acts as an etch barrier to W, preserving the metal thickness and reducing the risk of metal residue or via poisoning, 4) conversion of Si to $TiSi_2$ provides a low resistance path from the local interconnect to the via, and 5) the new process is compatible with a conventional CVD W via fill process.

Having thus described our invention what we claim as new and desire to secure as Letters Patent, is:

1. A method for fabricating semiconductor devices in integrated circuits including the use of contact metallization for local interconnect and via landing comprising the steps of:

Step 1. depositing a layer of titanium on a semiconductor substrate having an emitter structure disposed thereon, said titanium layer overlapping said emitter structure, Step 2. depositing a layer of tungsten over said titanium layer, Step 3. depositing a layer of silicon over said tungsten layer, Step 4. depositing a first layer of silicon dioxide over said silicon layer, Step 5. patterning said titanium layer, said tungsten layer and said silicon layer, Step 6. depositing a second layer of silicon dioxide over said first layer of silicon dioxide and a portion of said semiconductor substrate, Step 7. forming a photoresist mask layer over said second silicon dioxide layer and etching said second silicon dioxide layer through said photoresist mask, Step 8. using said etched second silicon dioxide layer as a mask, reactive ion etching said second silicon dioxide layer to form a recess in said second silicon dioxide layer above said silicon layer, Step 9. depositing a titanium layer on the surfaces of said recess, said titanium forming a low resistance titanium silicide by reaction with silicon at the surface of said silicon layer under said recess.

2. A method for fabricating semiconductor structures according to claim 1 further including the steps of:

Step 8. removing the unreacted portions of said titanium layer from said surfaces of said recess, Step 9. depositing a new layer of titanium on said recess surfaces and depositing a layer of titanium nitride over said new layer of titanium, Step 10. filling said recess with tungsten wherein said titanium silicide formed in Step 7 provides a low resistance interconnection between said tungsten layer deposited in Step 2 and said tungsten filled in said recess.

* * * * *